US006346903B1

(12) United States Patent
Messager

(10) Patent No.: US 6,346,903 B1
(45) Date of Patent: Feb. 12, 2002

(54) CONTROLLED ANALOGUE DRIVER SYSTEM

(75) Inventor: Philippe Messager, Nantes (FR)

(73) Assignee: Atmel Nantes S.A. (FR)

( * ) Notice: Subject to any disclaimer, the term of this patent is extended or adjusted under 35 U.S.C. 154(b) by 0 days.

(21) Appl. No.: 09/709,654

(22) Filed: Nov. 13, 2000

(30) Foreign Application Priority Data

Nov. 16, 1999 (FR) .......................................... 99 14349

(51) Int. Cl.[7] .............................................. H03M 1/78
(52) U.S. Cl. ..................................... 341/154; 345/211
(58) Field of Search .............................. 341/154, 161, 341/145; 345/95, 100, 210, 211

(56) References Cited

U.S. PATENT DOCUMENTS 5,343,221 A * 8/1994 Arakawa et al. ............ 345/211
5,434,599 A 7/1995 Hirai et al.
5,435,599 A * 7/1995 Hirai et al. ................. 345/100
5,561,442 A 10/1996 Okada et al.
5,619,221 A 4/1997 Hirai et al.
5,646,643 A 7/1997 Hirai et al.
5,739,804 A * 4/1998 Okumura et al. ............. 345/99

* cited by examiner

*Primary Examiner*—Brian Young
*Assistant Examiner*—John Nguyen
(74) *Attorney, Agent, or Firm*—Larson & Taylor PLC

(57) ABSTRACT

A device for generating a low-consumption controlling analogue voltage of stable value adapted for controlling LCD display segments that comprises an input circuit receiving an analogue voltage of given nominal value adapted to generate a picture analogue voltage of reduced value in a ratio k. A driver circuit is provided to receive the picture analogue voltage as a reference signal and a picture signal derived and reduced in the same ratio k from the low-consumption analogue voltage and comprises a differential amplifier supplied with a first and a second constant voltage value for outputting a first and a second switch control pulse. A switching circuit comprising a first switching branch outputting an amplified auxiliary switch control pulse synchronous with the reference signal and a second switching branch controlled by the amplified auxiliary switch control pulse is adapted to outputting the low-consumption analogue voltage switched to the analogue voltage of given value.

6 Claims, 7 Drawing Sheets

CONTROLLED ANALOGUE DRIVER SYSTEM

The invention relates to a device for generating a low-consumption controlling analogue voltage of a stable value, more specifically intended for controlling multi-input matrix circuits such as driver circuits for LCD liquid crystal displays, these circuits also being known as LCD "screen drivers".

Figure 1:
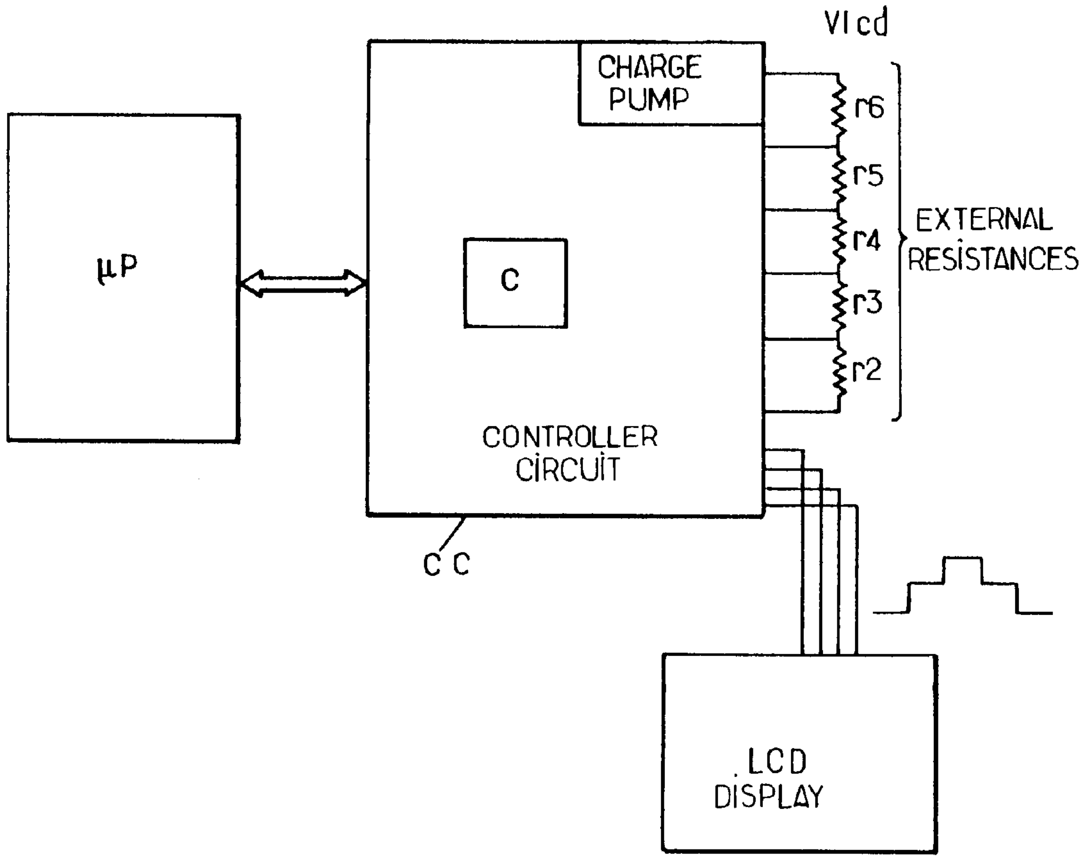
FIG.1. (PRIOR ART)

Turning to FIG. 1 illustrating the prior art, the driver systems for liquid crystal displays comprise a controller circuit CC driven by a microprocessor $\mu$P. This controller circuit CC has a controller strictly speaking C and a charge pump enabling control voltages of a higher amplitude, which may reach 9 V, to be generated from a supply voltage of a standard value. The control voltages are applied in the form of rectangular voltages of a given amplitude, 1.8 V, and switched between the ground voltage and different successive levels up to the maximum voltage applied by the charge pump, 6 levels of 0 to 9 volts by steps of 1.8 volts, these rectangular voltages of different levels in effect enabling the contrast level to be regulated depending on the address of the LCD segments controlled.

However, because of the relatively high capacitance, 200 pF, of the LCD segments, it is necessary to provide external capacitance, the purpose of which is to smooth the voltages finally applied. In spite of incorporating the above-mentioned capacitance, it nevertheless remains difficult to specify accurately the voltage levels applied to the LCD, leading to a degradation in the contrast finally applied, especially when dealing with the highest voltage values. The bridge divider becomes imbalanced as soon as a current is applied on one of the intermediate levels of the latter, since this current charges the capacitance of the LCD segments.

One solution to reducing the relative variations in contrast applied might be to use resistances of a lower value at the output of the controller circuit, which, by increasing the value of the current, will enable the relative variation in contrast to be reduced.

However, the solution outlined above has a major disadvantage in that it causes too high a current to be applied on the charge pump, making it necessary to increase the size of the charge pump and the external capacitance.

The objective of this invention is to overcome the disadvantages and limitations of the driver circuits used for LCD screen displays by employing a device for generating a low-consumption controlling analogue voltage of a stable value.

Another objective of this invention is to increase by a factor of at least 75 the autonomy of on-board or portable computer systems provided with LCD liquid crystal display screens in pilot mode, using a device for generating a low-consumption analogue controlling voltage having a stable value.

Another objective of this invention is to eliminate the external capacitance at intermediate levels of the bridge divider, which, by integrating the latter, will lead to a decrease in the number of inputs outputs and a reduction in the size of the chip.

Yet another objective of the present invention is to use a smaller size charge pump due to the very low consumption of the system as a whole, it being possible to eliminate the external capacitance on the charge pump and reduce the size of the chip accordingly.

Finally, another objective of the present invention is to reduce integration costs and achieve low consumption, whilst increasing the autonomy and accuracy of the display.

The device used to generate a low-consumption controlling analogue voltage of a stable value from an analogue voltage of a given nominal value, proposed by the invention, is remarkable due to the fact that it comprises an input circuit receiving this nominal value analogue voltage enabling a picture analogue voltage to be generated at a value reduced in a given ratio k. Furthermore, a driver circuit receives this picture analogue voltage as a reference value and a picture signal of the controlling analogue voltage, the picture signal being formed by this controlling analogue voltage reduced in the same given ratio k. This driver circuit has at least one differential amplifier supplied by a first constant voltage of an amplitude higher than the maximum value of the picture analogue voltage and by a second constant voltage of a given amplitude and outputs a first switch control pulse, synchronous with the reference signal and of a lower amplitude than the first constant voltage, and a second switch control pulse, synchronous with the reference signal but complemented with regard to the first control pulse. A switching circuit for the controlling analogue voltage, supplied by the analogue voltage of a given value, is provided, this switching circuit having at least a first switching branch modelled as an inverter/amplifier, controlled by the first switch control pulse and outputting an amplified auxiliary switch control pulse, synchronous with the reference signal, and a second switching branch, modelled as an inverter/amplifier, controlled by the amplified auxiliary switch control pulse and by the second switch control pulse and outputting the switched controlling analogue voltage at the analogue voltage of a given nominal value.

The device for generating a low-consumption, controlling analogue voltage of a stable value, proposed by the invention, finds application in driver circuits which use control signals of the stepped type, for example circuits such as those used for LCD display screens, particularly if these devices are provided in the form of integrated circuits in CMOS technology.

Figure 2:
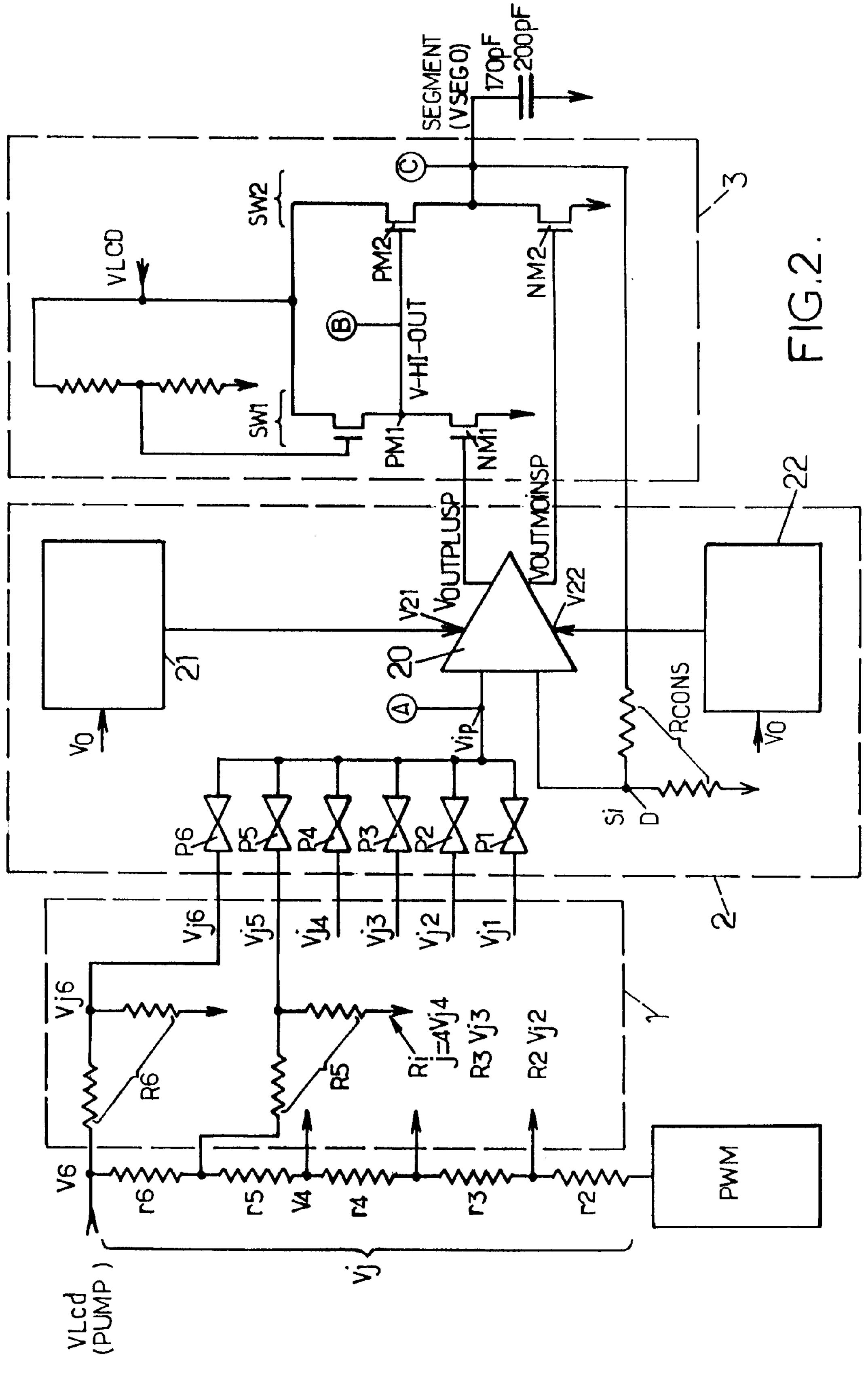
Figure 3A:
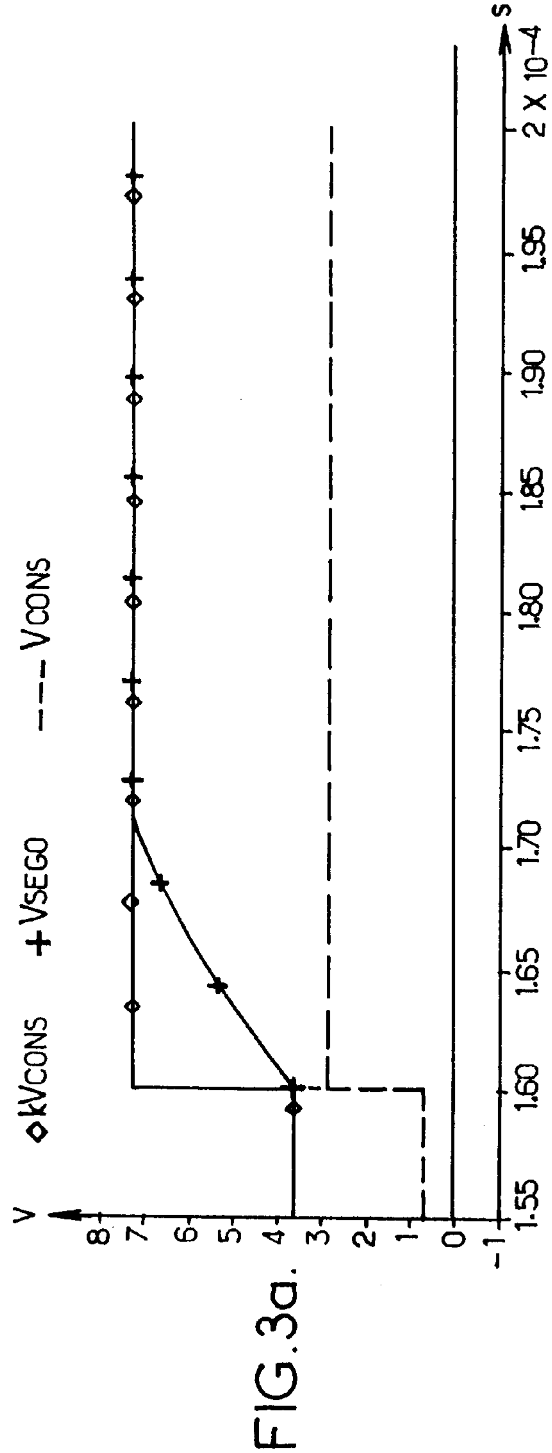
Figure 3B:
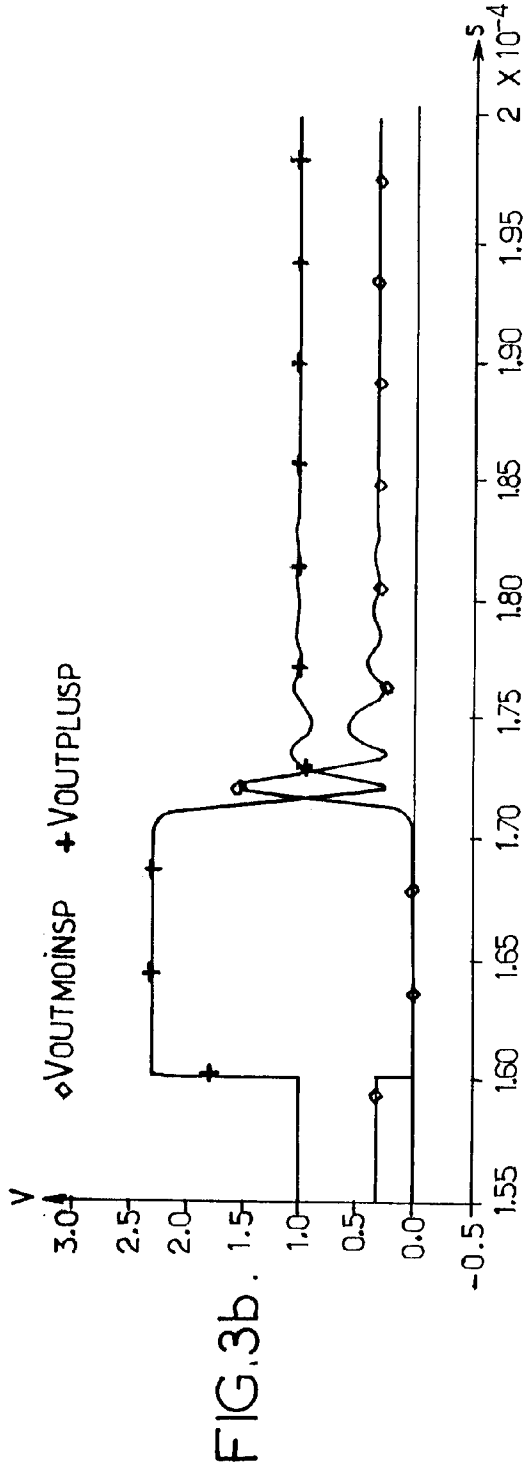
Figure 3C:
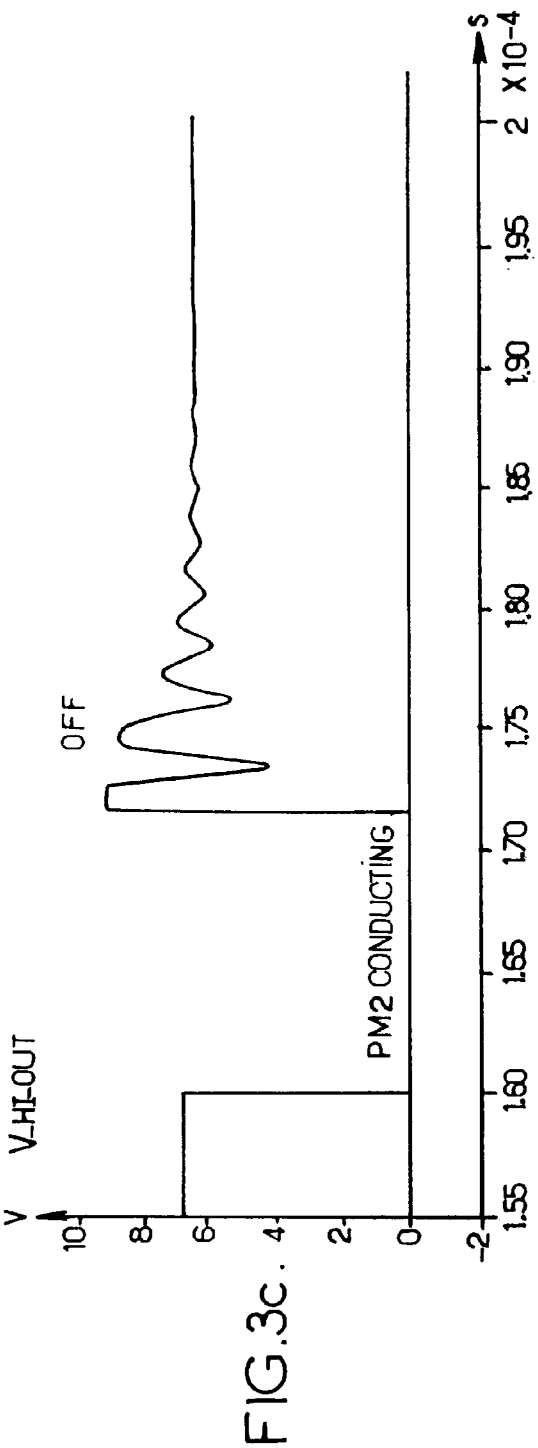
Figure 3D:
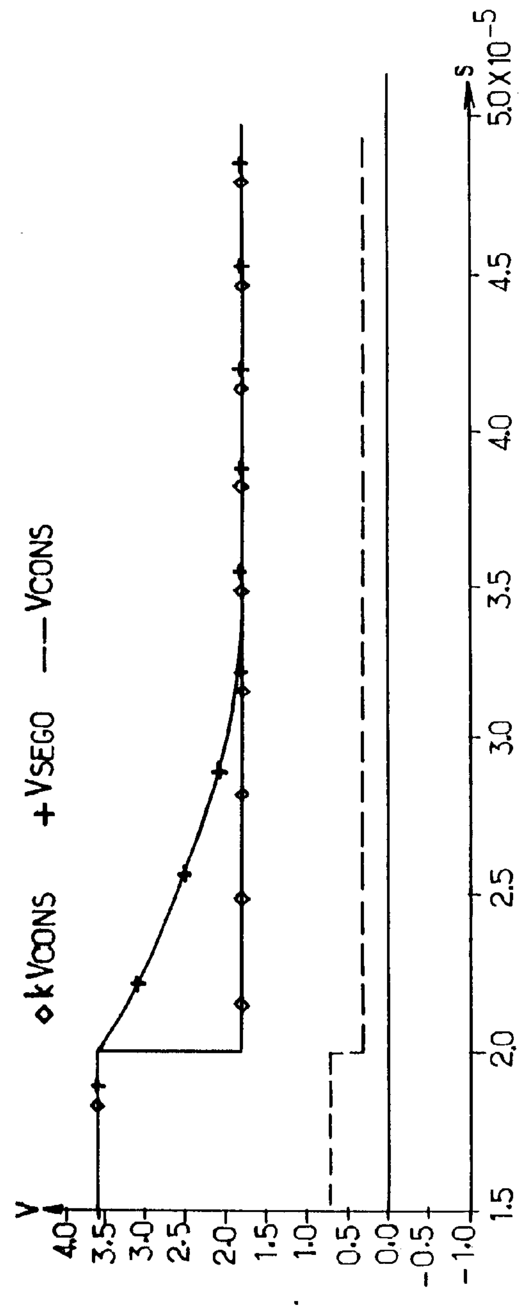
Figure 3E:
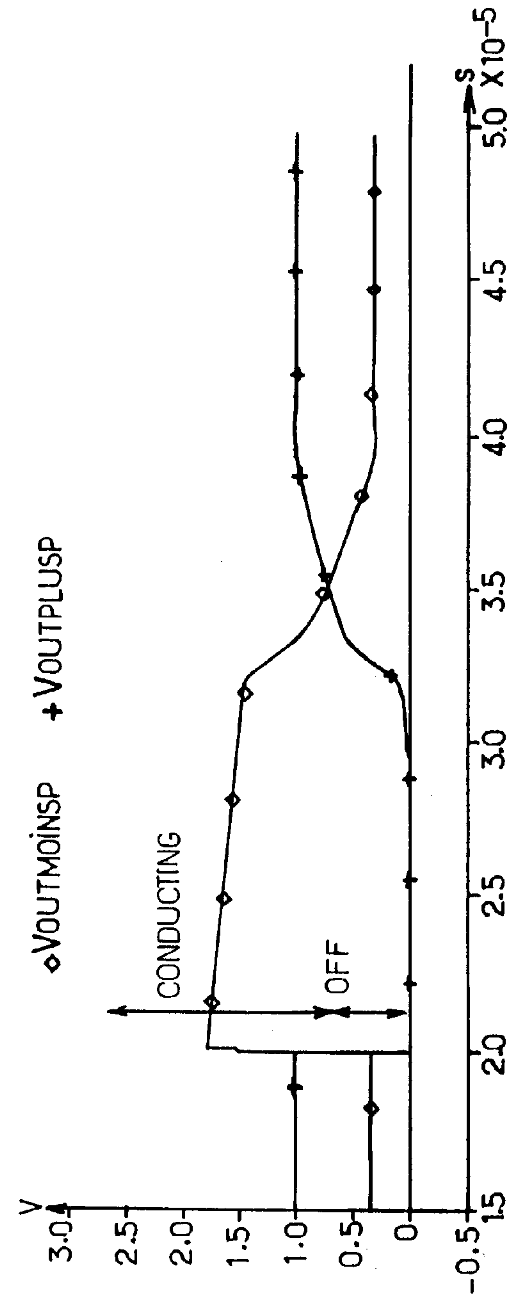
Figure 3F:
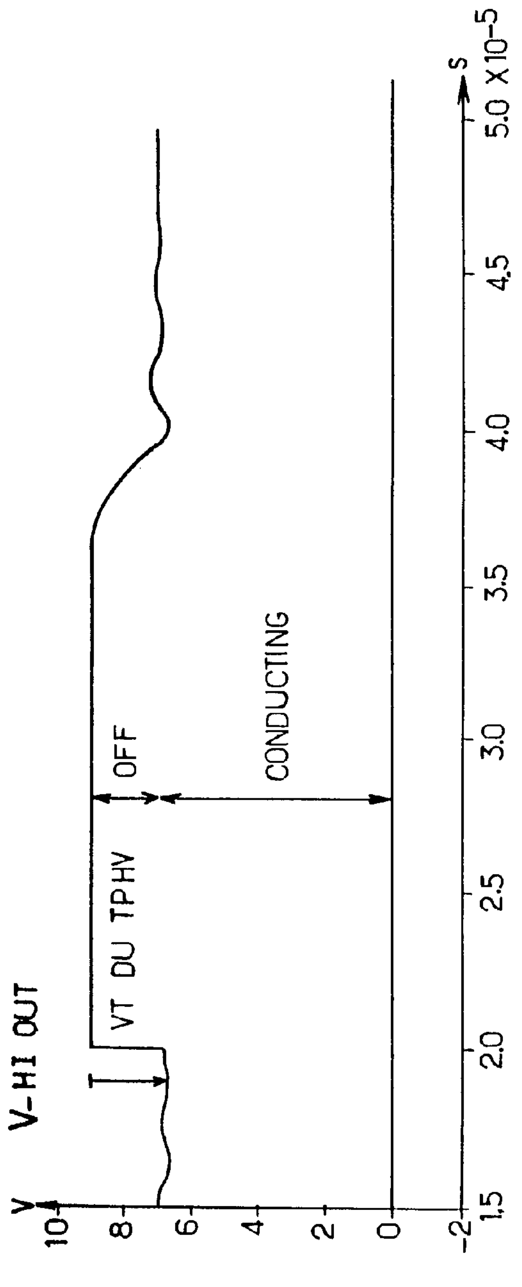

The invention will be more readily understood from the description given below with reference to the appended drawing, of which, with the exception of FIG. 1 relating to the prior art:

FIG. 2 depicts, by way of illustration, an operating diagram of the device for generating a low-consumption controlling analogue voltage of stable value, as proposed by the present invention;

FIGS. 3*a* to 3*c* represent different timing diagrams at test points of the device proposed by the invention during a transition in the charge of the controlling analogue voltage from an intermediate value to a higher value of a given amplitude;

FIGS. 3*d* to 3*f* show different timing diagrams at test points of the device proposed by the invention during a transition in the discharge of the controlling analogue voltage from an intermediate value to a lower value of a given amplitude;

FIGS. 3*g* to 3*j* show different timing diagrams at test points of the device proposed by the invention during charge/discharge transitions or vice versa in the controlling analogue voltage from an intermediate value to a higher value or respectively lower value of different amplitudes.

A more detailed description of the device for generating a low-consumption controlling analogue voltage of a stable value, proposed by the invention, will now be given with reference to FIG. 2 and the subsequent drawings.

The above-mentioned drawing shows the external resistors connected in series and denoted by $r_2$, $r_3$, $r_4$, $r_5$, $r_6$, these serially connected resistors linking the output of the charge pump applying the voltage Vlcd, constituting the analogue voltage of a given nominal value, to the output of a pulse width modulator shown by PWM, the resistors $r_2$ to $r_6$ connected in series thereby outputting voltages $V_2$, $V_3$, $V_4$, $V_5$, $V_6$, as illustrated in FIG. 2 and FIG. 1, in the form of a pulse of a given amplitude ranging between a zero value and a maximum value.

It should be noted that the pulse width modulator PWM enables the contrast applied to the liquid crystal display by means of the above-mentioned voltages $V_2$ to $V_6$ to be regulated.

As illustrated in FIG. 2, the device proposed by the invention also has an input circuit 1 which receives the analogue voltage Vlcd of a given nominal value and, of course, the voltages $V_5$, $V_4$, $V_3$, $V_2$ intended to accompany the analogue voltage of a given nominal value in order to obtain the desired contrast at the level of said liquid crystal display. The input circuit 1 enables a picture analogue voltage to be generated, denoted by Vjp, of a value reduced in a given ratio k. By way of example although this is not restrictive, the ratio k may be equal to k=1/5. It should be pointed out in particular that in the case of the analogue voltage Vlcd of a given nominal value, this value having a maximum value of 9 volts for example, all the voltage values are subjected to the same reduction by the ratio k given above. Accordingly, a set of reduced values is obtained, denoted by $Vj_6$, $Vj_5$, $Vj_4$, $Vj_3$, $Vj_2$, each corresponding to the voltage values $V_6$, $V_5$, $V_4$, $V_3$, $V_2$ respectively.

Furthermore, as illustrated in the same FIG. 2, the device proposed by the invention has a driver circuit 2 which receives the picture analogue voltage jp, i.e. $Vj_2$ to $Vj_6$, this picture analogue voltage Vjp constituting in effect a reference value, written as $V_{CONS}$, and a picture signal Si of the controlling analogue voltage $V_{SEG0}$, this picture signal being formed by said controlling analogue voltage reduced by the same given ratio k. The driver circuit 2 has at least one differential amplifier 20, which in fact receives the reference value $V_{CONS}$ and the picture signal Si mentioned above.

As illustrated in FIG. 2, the differential amplifier 20 is supplied by a first constant voltage, denoted by $V_{21}$, and by a second constant voltage, denoted by $V_{22}$, of a given amplitude. Generally speaking, the first constant voltage $V_{21}$ is higher than the maximum value of the picture analogue voltage Si mentioned above.

The first constant voltage $V_{21}$ is a low voltage which is used for supply purposes and which reduces consumption. The input levels of the differential amplifier 20 must be lower than that of the first supply voltage $V_{21}$, hence the reduction by k.

The differential amplifier 20 outputs a first switch control voltage, denoted by $V_{OUTPLUSP}$, this first voltage being synchronous with the reference signal $V_{CONS}$ and of an amplitude lower than the first constant voltage $V_{21}$. The differential amplifier 20 also outputs a second switch control pulse, denoted by $V_{OUTMOINSP}$, synchronous with the reference signal $V_{CONS}$ but complemented with regard to the first control pulse $V_{OUTMOINSP}$.

Finally, the device proposed by the invention has a circuit 3 for switching the controlling analogue voltage $V_{SEG0}$. This circuit is supplied by the analogue voltage of a given nominal value Vlcd and comprises at least a first switching branch, denoted by $SW_1$, modelled as an inverter/amplifier, this first switching branch being controlled by the first switch control pulse $V_{OUTPLUSP}$ and outputting an amplified auxiliary switch control pulse, denoted by $V_{-HI-OUT}$, this latter being synchronous with the reference signal $V_{CONS}$.

Furthermore, the switching circuit 3 has a second switching branch denoted by $SW_2$, modelled as an inverter/amplifier and controlled by the amplified auxiliary control pulse $V_{-HI-OUT}$ and by the second switch control pulse $V_{OUTMOINSP}$. The second switching branch $SW_2$ therefore outputs the controlling analogue voltage $V_{SEG0}$ switched tot the analogue voltage of a given nominal value Vlcd. In FIG. 2, the output of the switching circuit 3 for the controlling analogue voltage, which in effect constitutes the output of the device for generating a controlling analogue voltage as proposed by the invention, is connected to a capacitance in the order of 170 pF to 200 pF, representing the input capacitance of the segments of the LCD display to be controlled.

Generally speaking, in the case of an application, although this is not restrictive, in which the analogue voltage of nominal value Vlcd has as its value one of the values of a set of discrete values, the values $V_6$, $V_5$, $V_4$, $V_3$, $V_2$, these discrete values being between a maximum value which might be 9 volts in the case of a LCD screen display driver for example, and a reference value such that the ground voltage is 0, the input circuit 1 has at least one bridge divider Rj, denoted by $R_2$ to $R_6$ in FIG. 2, although for reasons of clarity only the bridge dividers $R_6$ and $R_5$ are shown in the drawing. Each bridge divider receives the analogue voltage of nominal value Vj, i./e. $V_6$, $V_3$, $V_2$, and outputs the picture analogue voltage of a value reduced in the given ratio k. As shown in FIG. 2, the picture analogue voltage of reduced value is denoted by $Vj_6$, $Vj_5$, $Vj_4$, $Vj_3$ and $Vj_2$, each of these voltages being in fact output by the corresponding bridge divider $R_6$ to $R_2$.

By preference and in one particular embodiment although this is not restrictive, the ratio k may be 1/5 and, for a maximum value $V_{MAX}$=9 volts, the value of the maximum voltage of the picture analogue voltage $Vj_6$ will then be 1.8 volts.

In addition, although this is not restrictive, the input circuit 1 may have an analogue gate Pj, in fact an array of elementary gates denoted by $P_1$ to $P_6$ in FIG. 2, each analogue gate Pj having a threshold value corresponding to the picture analogue value of reduced value $Vj_2$ to $Vj_6$, the corresponding analogue gate outputting the picture analogue value Vjp of reduced value.

FIG. 2 shows the array of analogue gates Pj, positioned not within the input circuit 1 but instead in the driver circuit 2 receiving the analogue voltage Vjp. It should be pointed out in particular that each analogue gate Pj outputs the corresponding analogue voltage Vjp depending on the threshold value applied. The array of analogue gates mentioned above may be placed either within the input circuit 1 or, alternatively, in the driver circuit 2.

Furthermore, as illustrated in FIG. 2, the driver circuit 2 has a bridge divider, denoted by $R_{CONS}$, this bridge divider being a bridge whose dividing ratio is equal to the ratio k of the given value mentioned above. Said bridge divider receives the controlling analogue voltage $V_{SEG0}$ and outputs the picture signal Si of said controlling analogue voltage.

The differential amplifier 20 incorporated in the driver circuit 2 also has a first input for a first stable reference voltage $V_{21}$ providing the supply to said differential amplifier. The first stable reference voltage $V_{21}$ is selected at a first level of a given voltage value. The differential amplifier also has a second input for a second stable reference voltage $V_{22}$, which is chosen at a second voltage level value. The stable reference supply voltages $V_{21}$ and $V_{22}$ may advantageously be output by the corresponding circuits 21 and 22, which, from a same stable reference voltage $V_0$ applied by what is known as a "band gap" circuit, may output a first stable reference voltage at an intensity in the order of 200 $\mu$A with regard to the circuit 21 and a second stable reference voltage at an intensity of a few $\mu$ with regard to the circuit 22. The reference voltage $V_0$ supplying the circuits 21 and 22 may be selected as being 1.25 V for example on the basis of circuits of the "band gap" type mentioned above.

Accordingly, supplied under these conditions, the differential amplifier 20 receives the picture voltage $V_{jp}$ applied by the corresponding bridge divider Rj and of course by the corresponding logic bridge Pj on a positive terminal Vp and, on its negative terminal, denoted by Vn, the picture signal Si in turn applied by the bridge divider $R_{CONS}$ mentioned earlier in the description.

Under these conditions, the differential amplifier 20 outputs, firstly, the first switch control pulse and, secondly, the second switch control pulse mentioned earlier in the description.

A more detailed description of the circuit 3 for switching the controlling analogue voltage $V_{SEG0}$ to the analogue voltage of nominal value Vlcd will now be given below.

Referring to FIG. 2, said circuit 3 may advantageously have a first inverter/amplifier forming the first switching branch, denoted by $SW_1$. The first inverter amplifier has a PMOS transistor denoted by $PM_1$ and a NMOS transistor denoted by $NM_1$, these transistors being connected in a cascading arrangement by their common drain/source point between the analogue voltage of nominal value Vlcd and the reference voltage Vref, still at ground voltage. The gate electrode of the PMOS transistor $PM_1$ of the first branch receives a polarisation voltage equal to a fraction of the analogue voltage of nominal value and the gate electrode of this transistor receives the first switch control pulse $V_{OUTPLUSP}$ mentioned earlier in the description. Accordingly, the PMOS transistor $PM_1$, whose gate electrode is brought to a constant potential, will fulfill the role of a resistor whilst the NMOS transistor $NM_1$ controlled by said first switch pulse may also play the role of an inverter switch, the common drain/source point between said transistors outputting the amplified auxiliary switch control pulse $V_{-HI-OUT}$ mentioned earlier in the description.

The switching circuit 3 also has a second inverter/amplifier forming the second switching branch $SW_2$. It has a PMOS transistor $PM_2$ and a NMOS transistor $NM_2$ connected in a cascade arrangement by their common drain/source point between the analogue voltage of given nominal value Vlcd and the reference voltage Vref. The gate electrode of the PMOS transistor $PM_2$ receives the amplified auxiliary switch control pulse $V_{-HI-OUT}$, i.e. the voltage output by the common drain/source point of the transistors $PM_1$ and $NM_1$ of the first branch $SW_1$. Conversely, the gate electrode of the NMOS transistor $NM_2$ of the second branch $SW_2$ receives the second switch control pulse applied by the differential amplifier 20.

Under these conditions, the common drain/source point of the PMOS and NMOS transistors $PM_2$ and $NM_2$ of the second branch $SW_2$ output the low-consumption controlling analogue voltage $V_{SEG0}$ of stable value switched to the value of the analogue voltage of given value Vlcd mentioned earlier in the description.

An explanation will now be given of how the device proposed by the invention and illustrated in FIG. 2 operates, with reference to the timing diagrams plotting test points, these timing diagrams being given in FIGS. 3*a* to 3*j*.

Said test points are those constituted by:

A: positive input Vp of the differential amplifier 20;

B: drain/source junction point between the transistors $PM_1$ et $NM_1$ constituting the first switching branch $SW_1$;

C: junction point between the PMOS transistor $PM_2$ and the NMOS transistor $NM_2$ constituting the second switching branch $SW_2$ outputting the controlling analogue voltage $V_{SEG0}$.

D: centre point of the bridge divider $R_{CONS}$ outputting the picture analogue signal Si.

Charge Transition from 3.6 V to 7.2 V

FIG. 3*a* shows the corresponding transition for a reference signal in a corresponding ratio k=1/5 at said test point A, the reference signal and k times the value of the latter being given.

FIG. 3*b* shows the evolution of the first control pulse $V_{OUTPLUSP}$ and the second control pulse $V_{OUTMOINSP}$. As may be seen, said control pulses are synchronous with the reference signal but substantially complemented, the first control pulse evolving between a low analogue value substantially equal to 1 V and a high analogue value below the first constant voltage supplying the differential amplifier 20, this first constant voltage $V_2$, having been selected as 2.7 V. The high analogue voltage of the first control pulse is in the order of 2.3 V.

Similarly, the second control pulse evolves between a high first analogue value substantially equal to 0.3 V and a low analogue value substantially equal to 0 V for the parts that are complemented relative to the first control pulse.

Said control pulses and in particular the difference between the signals and the high and low analogue values respectively of the latter, these differences essentially being 2.3 V, is then somewhat amplified by the circuits of the first switching branch $SW_1$ and second switching branch $SW_2$ constituting the switching circuit 3 under the above conditions.

Turning to FIG. 3*c*, it may be noted that when the transistor $NM_1$ of the first switching branch $SW_1$ is switched, the first control voltage $V_{OUTPLUSP}$ causes the amplified auxiliary control pulse $V_{-HI-OUT}$ to appear at a transition between the value 6.8 V and 0 V, this auxiliary control pulse being inverted relative to the first control pulse. Whilst the first control pulse is at the high analogue value, the second control pulse is at the low analogue value, in which case the transistor $PM_2$ is conducting, the junction point between the PMOS and NMOS transistors $PM_2$ and $NM_2$ of the second switching branch $SW_2$ then being switched to the value of said analogue voltage having a nominal voltage Vlcd. The voltage at test point C evolves as illustrated in 3*a* with a time constant given by the value of the load capacitance of the LCD display segments.

The picture voltage Si evolves accordingly, which enables the difference at the input of the differential amplifier 20 to be reduced and the first and second switch control pulses are therefore balanced on switching, as illustrated in FIG. 3*b*. When the balanced value is essentially reached, the transistor $PM_2$ of the second switching branch $SW_2$ is switched off and the voltage at test point C is then established at the charge value corresponding to the analogue voltage of nominal value Vlcd. The transitory switching phenomena are illustrated in FIG. 3*c* after the transistor $PM_2$ mentioned above has been switched. The segment is then charged at the nominal voltage value mentioned above.

Discharge from 3.6 V to 1.8 V Due to Transition of the Reference Signal by a Corresponding Value This situation is illustrated by the timing diagrams of 3*d*, 3*e* and 3*f*.

In this situation, FIG. 3*d* represents the transition corresponding to the reference signal and at k times the transition of the latter.

Turning to FIG. 3*e*, the first switch control pulse $V_{OUTPLUSP}$ then shifts synchronously with the reference signal from a value of 1 V to the value of 0 V, whereas, conversely, the second switch control pulse $V_{OUTMOINSP}$ shifts from the value of 0.3 V to the maximum value 1.8 V. Whereas the low level analogue value of the first switch control pulse remains substantially equal to zero as the voltages at the input of the differential amplifier 20 are being balanced, the high analogue value of the second switch control pulse $V_{OUTMOINSP}$ decreases more or less regularly until the voltages Vp and Vm at the input of the differential amplifier 20 are balanced.

Under these conditions, as depicted in FIG. 3*f*, the transistor $PM_2$ of the second switching branch $SW_2$ remains off, since it passes from a semi-off state close to the off value $V_T$(7V) to an off value. It is the second control pulse $V_{OUTMOINSP}$, as illustrated in FIG. 3*e*, which changes to 1.8 volts and hence a value higher than the off value $V_T$ (0, 7 V) of the NMOS transistor $NM_2$ of the second switching branch. The transistor $NM_2$ is then conducting and the discharge is produced at the output as illustrated in FIG. 3*f*.

When the balance has been re-established by means of the picture signal Si at the level of the input values Vp and Vm of the differential amplifier 20, the initial state is then restored, the transistor $NM_2$ of the second switching branch $SW_2$ being off and the voltage $V_{SEG0}$ having reached the new value of the analogue nominal voltage Vlcd. The transistor $PM_2$ is used for the charge and the transistor $NM_2$ for the discharge at the output.

Different Successive Transitions by Multiple Values of 1.8 V Either in Charge or Discharge These situations are illustrated in FIGS. 3*g*, 3*h*, 3*i* and 3*j*.

Figure 3G:
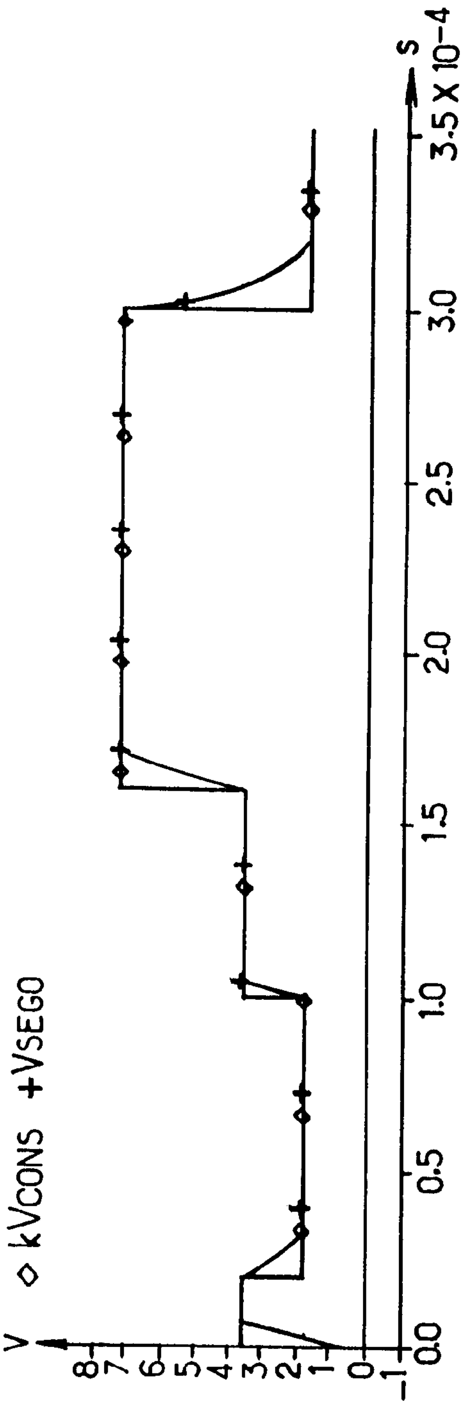

FIG. 3*g* shows in succession different discharge and charge transitions, a transition in amplitude by 1.8 V, then in charge, a transition of 3.6 V in amplitude, then again in discharge, a transition in amplitude of 5.4 V, k times the reference signal.

Figure 3H:
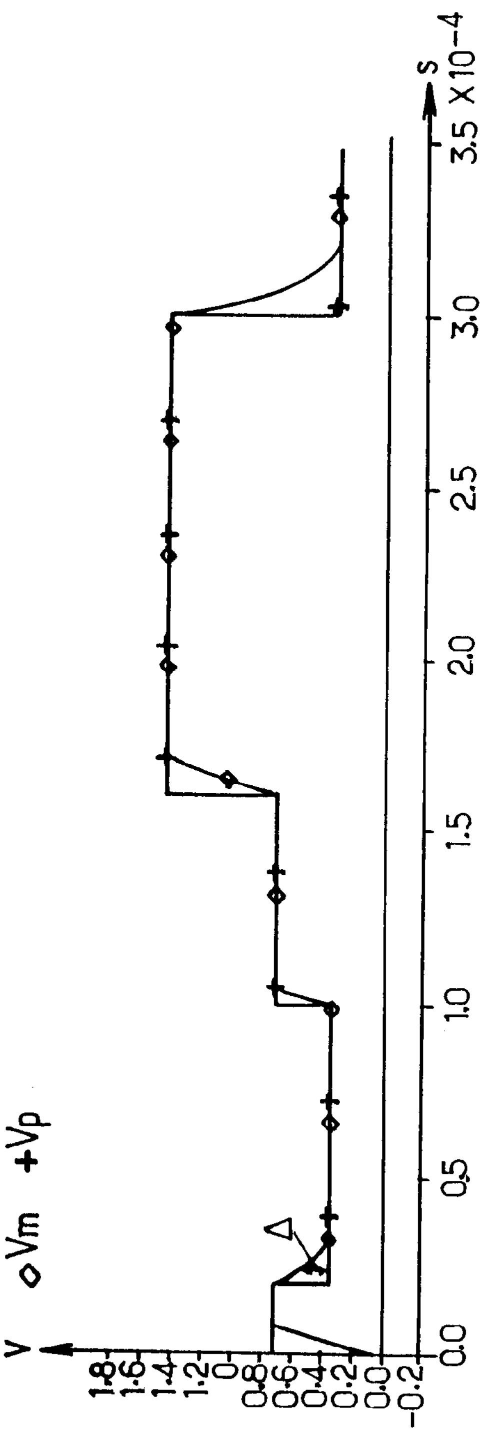

FIG. 3*h* shows the voltage values corresponding to the transitions illustrated in FIG. 3*g*, firstly, at test point A, i.e. the voltage at the point of the positive input terminal Vp of the differential amplifier 20 receiving the picture analogue voltage Vjp as a reference value and, secondly, at test point D to which the picture signal Si is applied, i.e. on the negative input Vn of the differential amplifier 20. In particular, it may be noted that the changes in voltages at said points are substantially in line with those of the voltages in 3*g*, the affinity relationship on the time axis being equal to k.

FIG. 3*h* shows the changes in the picture analogue voltage and the picture signal Si at the positive and negative inputs Vp and Vm respectively of the differential amplifier 20.

Figure 3I:
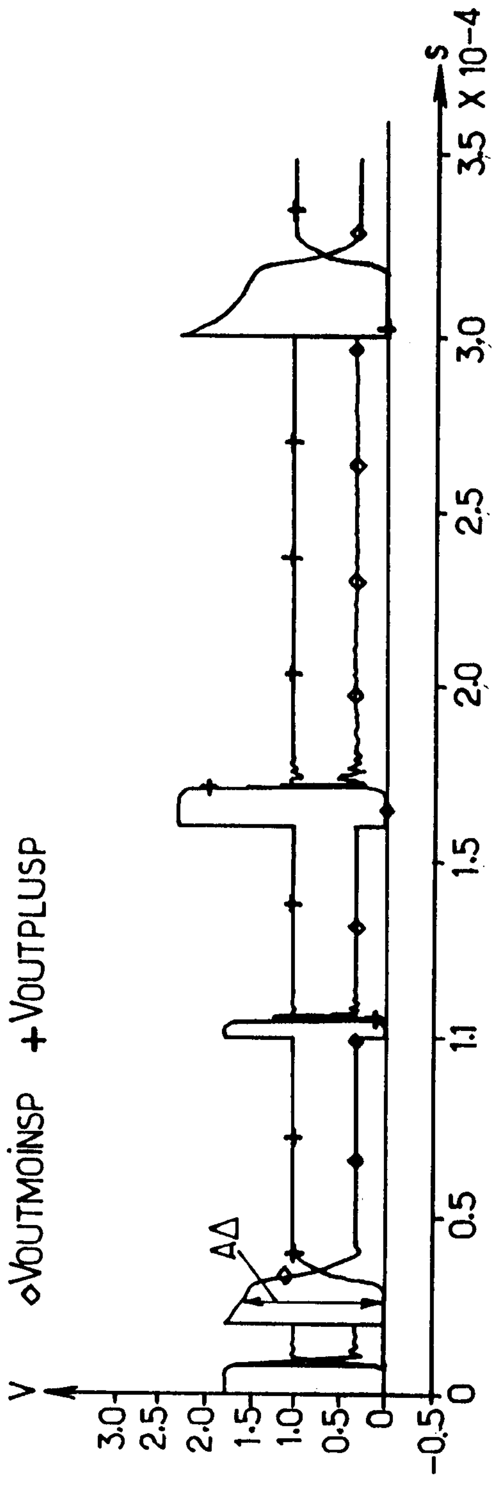

FIG. 3*i* shows the first switch control pulse $V_{OUTPLUSP}$ and the second switch control pulse $V_{OUTMOINSP}$.

Turning to the timing diagrams of FIGS. 3*h* and 3*i*, it may be seen that the difference in amplitude A between the picture analogue voltage Vp, constituting the reference signal, and the picture signal Si on the input terminal Vm is amplified AΔ by the second switch control pulse to achieve a balance corresponding to a zero amplitude difference Δ=0, the controlling analogue voltage $V_{SGE0}$ having been switched to its final value, i.e. the value of the analogue voltage of nominal value Vlcd.

Figure 3J:
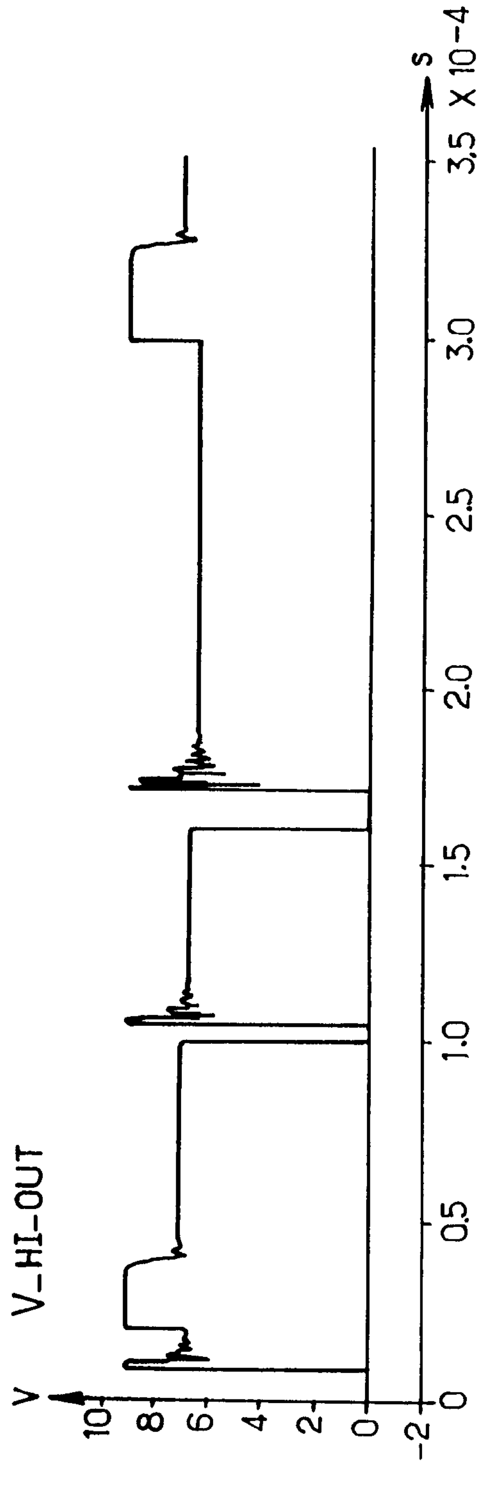

Finally, FIG. 3*j* shows the corresponding amplified auxiliary switch control pulse $V_{-H\text{-}IN\text{-}OUT}$.

What is claimed is:

1. A device for generating a low-consumption controlling analogue voltage of stable value, from an analogue voltage of a given nominal value, said device comprising:

an input circuit receiving said analogue voltage of a given nominal value and enabling a picture analogue voltage to be generated having a value reduced in a given ratio k;

a driver circuit receiving said picture analogue voltage as a reference signal and a picture signal of said low-consumption controlling analogue voltage, said picture signal being formed by said low-consumption controlling analogue voltage reduced in the same given ratio k, said driver circuit having at least one differential amplifier supplied by a first constant voltage of an amplitude higher than the maximum value of said picture analogue voltage and by a second constant voltage of a given amplitude and outputting a first switch control pulse synchronous with said reference signal and of an amplitude lower than said first constant voltage and a second switch control pulse synchronous with said reference signal but complemented relative to said first switch control pulse;

a switching circuit for said controlling analogue voltage, said switching circuit being supplied by said analogue voltage of a given nominal value and comprising at least:

a first switching branch forming an inverter/amplifier, controlled by said first switch control pulse, said first switching branch outputting an amplified auxiliary switch control pulse, synchronous with said reference signal, and a second switching branch, forming an inverter/amplifier controlled by said amplified auxiliary switch control pulse and said second switch control pulse, said second switching branch outputting said controlling analogue voltage switched to said analogue voltage of a given nominal value.

2. The device of claim 1, wherein said analogue voltage of nominal value having as its value one of the values of a set of discrete values ranging between a maximum value and a reference value, said input circuit comprises at least:

a bridge divider operating at a ratio k of a given value, said bridge divider receiving said analogue voltage of nominal value and outputting said picture analogue voltage of a reduced value;

an analogue gate with a threshold value corresponding to said picture analogue voltage of reduced value, said analogue gate applying said picture analogue voltage of reduced value.

3. The device of claim 1, wherein said driver circuit also has a bridge divider operating at a ratio k of said given value, said bridge divider receiving said controlling analogue voltage and outputting said picture signal of said low-consumption controlling analogue voltage.

4. The device of claim 1, wherein said differential amplifier comprises a first input for a first stable reference voltage at a first voltage level and a second input for a second stable reference voltage at a second voltage level, said differential amplifier outputting said first and said second switch control pulse.

5. The device of claim 1, wherein said switching circuit comprises:

said first inverter/amplifier forming said first switching branch and comprising a first PMOS transistor and a first NMOS transistor connected in a cascade arrangement by their common drain/source point between said analogue voltage of a given nominal value and the reference voltage, the gate electrode of said first PMOS transistor of said first branch receiving a polarisation voltage equal to a fraction of said analogue voltage of nominal value and the gate electrode of said first NMOS transistor of said first switching branch receiving said first switch control pulse;

said second inverter/amplifier forming said second switching branch and comprising a second PMOS transistor and a second NMOS transistor connected in a cascade arrangement by their common drain/source point between said analogue voltage of a given nominal value and the reference voltage, the gate electrode of said second PMOS transistor of the second branch receiving the voltage applied by the common drain/source point of said first PMOS and first NMOS transistors of the first branch and the gate electrode of the second NMOS transistor of the second branch receiving said second switch control pulse applied by the differential amplifier, said common drain/source point of said second PMOS and NMOS transistors of said second branch outputting said low-consumption controlling analogue voltage of stable value switched to the value of said analogue voltage of a given nominal value.

6. The device of claim 5, wherein said second constant voltage is higher than or equal to the off voltage of said second NMOS transistor of said second switching branch.

* * * * *